United States Patent
Kishi

(10) Patent No.: US 8,871,026 B2
(45) Date of Patent: Oct. 28, 2014

(54) VITREOUS SILICA CRUCIBLE FOR PULLING SINGLE-CRYSTAL SILICON AND METHOD OF MANUFACTURING THE SAME

(75) Inventor: Hiroshi Kishi, Akita (JP)

(73) Assignee: Japan Super Quartz Corporation, Akita-Ken (JP)

( * ) Notice: Subject to any disclaimer, the term of this patent is extended or adjusted under 35 U.S.C. 154(b) by 1407 days.

(21) Appl. No.: 12/303,147

(22) PCT Filed: Sep. 29, 2008

(86) PCT No.: PCT/JP2008/067653
§ 371 (c)(1),
(2), (4) Date: Dec. 2, 2008

(87) PCT Pub. No.: WO2009/041685
PCT Pub. Date: Apr. 2, 2009

(65) Prior Publication Data
US 2010/0236473 A1    Sep. 23, 2010

(30) Foreign Application Priority Data
Sep. 28, 2007   (JP) ................................. 2007-256156

(51) Int. Cl.
*C30B 35/00* (2006.01)
*C30B 15/10* (2006.01)
*C03C 3/06* (2006.01)
*C03C 19/00* (2006.01)

(52) U.S. Cl.
CPC . *C30B 15/10* (2013.01); *C03C 3/06* (2013.01); *C03C 19/00* (2013.01); *C30B 35/002* (2013.01); *C03C 2201/80* (2013.01); *C03C 2203/10* (2013.01); *C03C 2204/08* (2013.01)

USPC .............................. 117/200; 117/206; 65/347

(58) Field of Classification Search
USPC ..................... 117/200, 206; 65/347
See application file for complete search history.

(56) References Cited

U.S. PATENT DOCUMENTS

| | | |
|---|---|---|
| 4,416,680 A | 11/1983 | Brüning et al. |
| 4,935,046 A | 6/1990 | Uchikawa et al. |

(Continued)

FOREIGN PATENT DOCUMENTS

| | | |
|---|---|---|
| EP | 1024118 | 8/2000 |
| JP | 56-149333 | 11/1981 |

(Continued)

OTHER PUBLICATIONS

Patent Abstracts of Japan. English abstract and computer translation of JP 2000-159593 (2000).*

(Continued)

*Primary Examiner* — Matthew Song
(74) *Attorney, Agent, or Firm* — Greenblum & Bernstein, P.L.C.

(57) ABSTRACT

In order to provide a vitreous silica crucible which does not employ a crystallization accelerator but is difficult to deform during its use even under high temperature, and is easily manufactured, there is provided a vitreous silica crucible for pulling single-crystal silicon wherein the outer surface layer is formed of a bubble-containing vitreous silica layer, the inner surface layer is formed of a vitreous silica layer whose bubbles are invisible to the naked eye, a surface of the outer surface layer includes an unmelted or half-melted silica layer (abbreviated as a half-melted silica layer), and the center line average roughness (Ra) of the half-melted silica layer is 50 to 200 μm, also preferably, and the thickness of the half-melted silica layer is 0.5 to 2.0 mm.

2 Claims, 4 Drawing Sheets

(56) References Cited

U.S. PATENT DOCUMENTS

| | | | |
|---|---|---|---|
| 5,989,021 A * | 11/1999 | Sato et al. | 432/264 |
| 6,136,092 A | 10/2000 | Sato et al. | |
| 2003/0012898 A1 | 1/2003 | Kemmochi et al. | |
| 2003/0012899 A1 | 1/2003 | Kemmochi et al. | |
| 2003/0106491 A1 | 6/2003 | Kemmochi et al. | |
| 2004/0018361 A1 | 1/2004 | Takahashi et al. | |
| 2004/0187771 A1 | 9/2004 | Tsuji et al. | |

FOREIGN PATENT DOCUMENTS

| | | | |
|---|---|---|---|
| JP | 63-145984 | | 6/1988 |
| JP | 01-148782 | | 6/1989 |
| JP | 7-53295 | | 2/1995 |
| JP | 8-2932 | | 1/1996 |
| JP | 11-199370 | | 7/1999 |
| JP | 2000159593 A | * | 6/2000 |
| JP | 2003-95678 | | 4/2003 |
| JP | 2004-107163 | | 4/2004 |
| JP | 2004-123508 | | 4/2004 |
| JP | 2004-299927 | | 10/2004 |
| JP | 2004-352580 | | 12/2004 |
| JP | 2005-239533 | | 9/2005 |
| JP | 2007-153625 | | 6/2007 |

OTHER PUBLICATIONS

Patent Abstracts of Japan. English abstract and computer translation of JP 2004-352580 (2004).*
Patent Abstracts of Japan. English abstract and computer translation of JP 07-053295 (1995).*
English Language Abstract of JP 8-2932.
English Language Abstract of JP 11-199370.
English Language Abstract of JP 2004-352580.
English Language Abstract of JP 63-145984.
English Language Abstract of JP 2005-239533.
English Language Abstract of JP 7-53295.
English Language Abstract of JP 2007-153625.
U.S. Appl. No. 12/303,139, filed Dec. 2, 2008, and entitled "Silica Glass Crucible, Method of Manufacturing the Same and Pulling Method".
U.S. Appl. No. 12/351,207, filed Jan. 9, 2009, and entitled "Silica Glass Crucible Having Multilayered Structure".

* cited by examiner even under high temperature. Furthermore, since a crystallization accelerator is not used, there is no worry of lowering the quality of single-crystal silicon due to the crystallization accelerator coming into contact with a silicon melt.

VITREOUS SILICA CRUCIBLE FOR PULLING SINGLE-CRYSTAL SILICON AND METHOD OF MANUFACTURING THE SAME

TECHNICAL FIELD

The present invention relates to a vitreous silica crucible which is a vitreous silica crucible for pulling single-crystal silicon, has great strength under high temperature, and is capable of suppressing exfoliation of the outer surface upon pulling.

Priority is claimed on Japanese Patent Application No. 2007-256156, filed Sep. 28, 2007, the content of which is incorporated herein by reference.

BACKGROUND ART

A vitreous silica crucible is used for pulling single-crystal silicon. The inner portion (inner surface layer) of this vitreous silica crucible is formed of a transparent glass layer including substantially no bubbles because it has to be in contact with a silicon melt, and both outer portions (outer surface layers) are formed of a bubble-containing layer including a number of bubbles in order to disperse outword radiation heat and uniformly transfer the heat to the inside of a mold.

A rotary mold method has been known from the past as a method of manufacturing the above-mentioned vitreous silica crucible. This manufacturing method is a method of manufacturing a crucible by heating a vitreous silica powder accumulated on the inner surface of a rotary mold from the space side of a mold for vitrification, wherein during this heating and melting, vacuuming is performed to remove bubbles in a glass layer by sucking air in the vitreous silica powder-deposited layer from the mold side to reduce the pressure, thereby forming an inner surface layer formed of a transparent glass layer containing substantially no bubbles (JP-A No. 56-149333 and JP-A No. 01-148782).

In recent years, the temperature of a crucible during pulling tends to become higher with an increase in the size of a crucible. When the temperature of a crucible rises, the viscosity of glass is reduced, and as a result, the crucible possibly deforms during use. As a measure against this, a method of enhancing the strength by applying or containing a crystallization accelerator for glass to the surface, which allows the crucible to crystallize the glass under high temperature is known.

More specifically, it is described in JP-A No. 8-2932 that a crystallization accelerator (alkali metals, alkaline earth metals or the like) is applied to the surface of the inner surface layer of a vitreous silica crucible, or is contained in the inner surface layer, and the crystallization accelerator of the inner surface layer of the crucible is crystallized early as a nucleus when used. In addition, it is described in JP-A No. 11-199370 that a vitreous silica layer prevents the crystallization accelerator from coming into contact with a silicon melt by forming a layer containing a crystallization accelerator under the inner surface layer constructed of transparent glass. Furthermore, it is described in JP-A No. 2003-95678 that a crystallization accelerator is attached to the outer surface layer in addition to the inner surface layer of a crucible to increase the inner surface layer and the dimensional stability.

DISCLOSURE OF THE INVENTION

Problems to be Solved by the Invention

In the case of a crucible in which a crystallization accelerator is applied to the inner surface of the crucible, there is a worry that the crystallization accelerator comes into contact with a silicon melt and mixes therein which leads to the increase in an impurity concentration of single-crystal silicon. Meanwhile, in the case of a crucible in which a crystallization accelerator is applied to the outer surface of the crucible, the crystallization accelerator, at the time of pulling, comes into contact with a carbon container to which the crucible is fixed, and as a result, there may be a case where the crystallization accelerator reacts with carbon under high temperature and generates a gas which lowers the quality of single-crystal silicon.

Moreover, in order to include a crystallization accelerator in the inner side of a glass layer of a crucible, a device to mix a crystallization accelerator with a vitreous silica powder is needed when manufacturing a crucible. Consequently, it caused a problem that the manufacturing process and workload of crucibles was increased by preventing the crystallization accelerator from coming into contact with a silicon melt.

The present invention has solved the above-mentioned problems in known vitreous silica crucibles, and an object of the invention is to provide a vitreous silica crucible which does not employ a crystallization accelerator but is difficult to deform during its use even under high temperatures, and is easily manufactured.

Means for Solving the Problems

The invention relates to a vitreous silica crucible which has solved the above-mentioned problems by including the constitution described in the following [1] to [4], and to a method of manufacturing the same.

[1] A vitreous silica crucible which is for pulling single-crystal silicon, in which the outer surface layer is formed of a bubble-containing vitreous silica layer, the inner surface layer is formed of a vitreous silica layer whose bubbles are invisible to the naked eye, a surface of the outer surface layer has an unmelted or half-melted silica layer (abbreviated as a half-melted silica layer), and the center line average roughness (Ra) of the half-melted silica layer is 50 to 200 μm.

[2] The vitreous silica crucible described in [1] above, in which the thickness of the half-melted silica layer is 0.5 to 2.0 mm.

[3] The vitreous silica crucible described in [1] above, which includes the half-melted silica layer in a straight body portion of the crucible, the center line average roughness (Ra) of the half-melted silica layer in the straight body portion is 50 to 200 μm, and the thickness of the layer is 0.5 to 2.0 mm.

[4] A method of manufacturing a vitreous silica crucible, in which in accordance with a rotary mold method, a glass crucible is formed by heating a silica powder accumulated on the inner surface of a rotary mold, from a space side of the mold for vitrification, the glass crucible is taken out of the mold after cooling, and the half-melted silica layer formed of unmelted or half-melted silica powder on the outer surface is subjected to a honing process in order for the center line average roughness (Ra) of the half-melted silica layer to be 50 to 200 μm.

Effects of the Invention

The vitreous silica crucible of the invention is easily crystallized at the outer surface layer of the vitreous silica crucible under high temperature when using the crucible, by adjusting the center line average roughness (Ra) of a half-melted silica layer which exists on a surface of the outer surface layer to be 50 to 200 μm. Therefore, the crucible is hardly deformed under high temperatures, and a high single crystallization rate can be obtained upon pulling single-crystal silicon.

In addition, when processing a honing treatment after cooling and taking a glass crucible out of the mold in the manufacturing method according to a rotary mold method, the vitreous silica crucible of the invention can be treated the above-mentioned range for an outer surface roughness, and the crucible can be easily manufactured without significantly changing the known manufacturing method.

REFERENCE NUMERALS

C: Vitreous silica crucible
CC: Half-melted silica layer

BEST MODE FOR CARRYING OUT THE INVENTION

Hereinafter, the present invention will be illustrated in detail with reference to embodiments.

Figure 1:
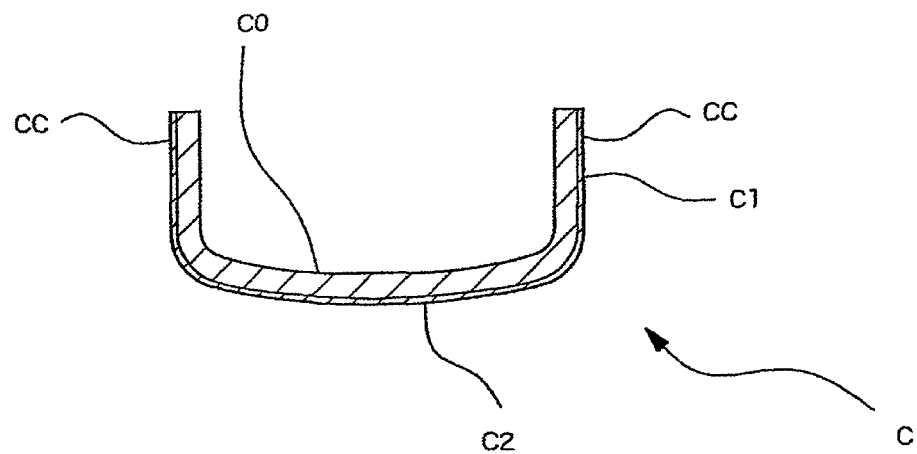
FIG. 1 is a longitudinal sectional view showing one embodiment of a vitreous silica crucible of the invention.

A vitreous silica crucible C of the invention is used to pull single-crystal silicon as shown in FIG. 1, and characterized in that the outer surface layer is formed of a bubble-containing vitreous silica layer, the inner surface layer is formed of a vitreous silica layer whose bubbles are invisible to the naked eye, the surface of the outer surface layer has an unmelted or half-melted silica layer (both the unmelted and half-melted ones are abbreviated as a half-melted silica layer) CC, and the center line average roughness (Ra) of the half-melted silica layer CC is 50 to 200 μm. The thickness of the half-melted silica layer CC is preferably 0.5 to 2.0 mm.

For the vitreous silica crucible C for pulling single-crystal silicon, an inner surface layer C0 of the crucible which comes into contact with a silicon melt is formed of a vitreous silica layer whose bubbles are invisible to the naked eye, meanwhile, the outer surface layer C1 of the crucible is formed of a bubble-containing vitreous silica layer in order to make external heating uniform.

The vitreous silica crucible C of the invention has the above inner surface layer C0 and the above outer surface layer C1, and is easily to crystallized at the outer surface layer and is difficult to deform under high temperatures for controlling the state of the outer surface layer.

According to studies by the present inventors and the like, for the vitreous silica crucible C in which the outer surface layer C1 is formed of a bubble-containing vitreous silica layer, the degree for crystallization of the outer surface layer differs depending on the surface state of the outer surface layer under high temperature when pulling single-crystal silicon. Knowledge that a vitreous silica crucible in which an unmelted vitreous silica layer exists on the outer surface thereof is easier to crystallize than a vitreous silica crucible in which the outer surface thereof is a vitreous silica surface with no half-melted vitreous silica layer on the outer surface of the crucible, was obtained.

Concretely, when an outer surface of the crucible is in any of the following states (A) to (D), (C) crystallizes more easily than (D), (B) crystallizes more easily than (C), and (A) crystallizes more easily than (B). An outer surface of the crucible crystallizes more easily in the order of A>B>C>D.

(A) A half-melted silica layer (the thickness of 0.5 to 2.0 mm) exists on the outer surface, and the center line average roughness (Ra) of the surface of the half-melted silica layer is 50 to 200 μm.

(B) A half-melted silica layer (the thickness of 0.5 to 2.0 mm) exists on the outer surface, and the center line average roughness (Ra) of the surface of the half-melted silica layer is less than 50 μm.

(C) The outer surface is a vitreous silica surface without a half-melted silica layer, and the center line average roughness Ra of the glass surface is 50 to 200 μm.

(D) The outer surface is a vitreous silica surface without a half-melted silica layer, and the center line average roughness Ra of the glass surface is less than 50 μm.

Based on the above knowledge, the vitreous silica crucible C of the invention is a vitreous silica crucible in which an unmelted or half-melted silica layer (both the unmelted and half-melted ones are abbreviated as a half-melted silica layer) CC exists on the surface of the outer surface layer (bubble-containing vitreous silica layer) C1, and the surface roughness of the half-melted silica layer CC is 50 to 200 μm by the center line average roughness (Ra).

In the vitreous silica crucible C of the invention, when the thickness of the half-melted silica layer CC is less than 0.5 mm, an accelerating effect on crystallization is not sufficient. Meanwhile, when the thickness of the half-melted silica layer CC is more than 2.0 mm, amount of outer surface exfoliation tends to increase and the strength of the crucible is adversely decreased.

In the vitreous silica crucible C of the invention, when the surface roughness of the half-melted silica layer CC is less than 50 μm by the center line average roughness (Ra), an accelerating effect on crystallization is not sufficient. Meanwhile, the surface roughness of the above half-melted silica layer CC is more than 200 μm, and the accelerating effect on crystallization is low.

In the vitreous silica crucible C of the invention, the outer surface of the crucible is easy to crystallize since the thickness and the surface roughness Ra of the half-melted silica layer CC are set as described above. Crystallization prevents the glass from softening, and the strength of the crucible is improved, so that it becomes difficult to deform the crucible under high temperatures when used. Because of this, the single crystallization rate is improved upon the pulling single-crystal silicon.

The vitreous silica crucible of the invention preferably has the above half-melted vitreous silica layer at least in a straight body portion, a center line average roughness (Ra) of the half-melted vitreous silica layer CC in the straight body portion of 50 to 200 µm, and a thickness of 0.5 to 2.0 mm. A crucible in which the straight body portion (side wall portion) is easily crystallised becomes difficult to deform.

Next, the method of manufacturing a vitreous silica crucible related to the invention will be illustrated.

Figure 3:
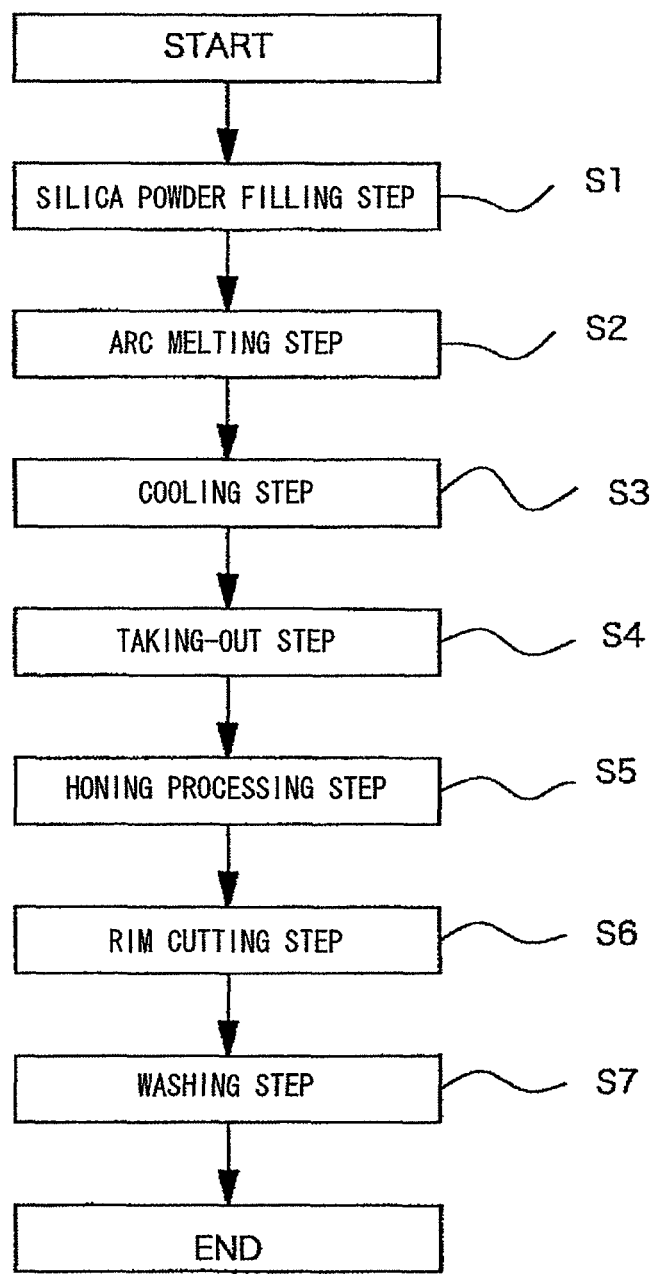
FIG. 3 is a flowchart showing one embodiment of a method of manufacturing a vitreous silica crucible of the invention.
Figure 4:
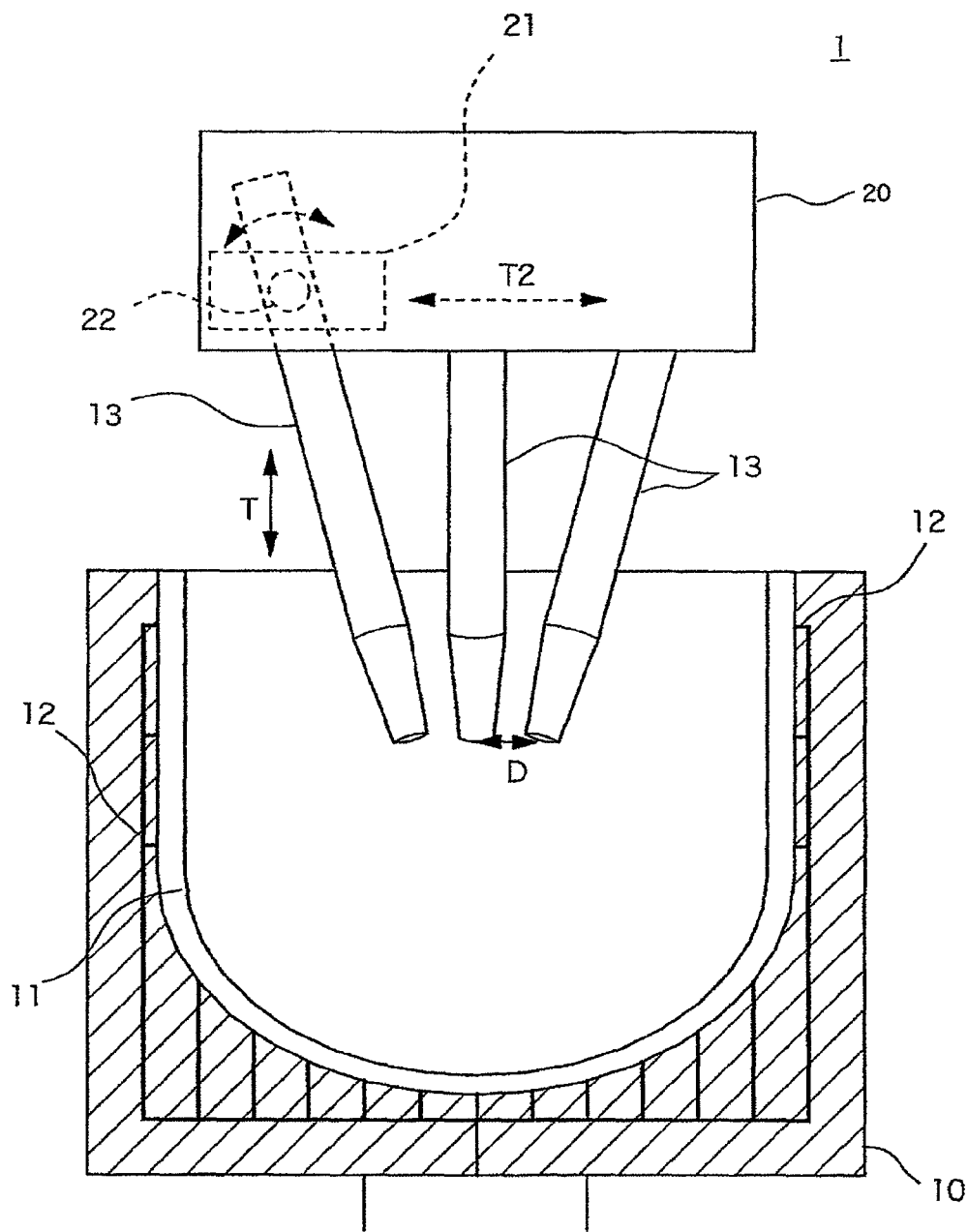
FIG. 4 is a front view showing an arc melter related to a method of manufacturing a vitreous silica crucible of the invention.

The vitreous silica crucible of the invention is manufactured by a rotary mold method using a vitreous silica crucible manufacturing device 1 as shown in FIG. 4, and has a silica powder filling step S1, an arc melting step S2, a cooling step S3, a taking out step S4, a honing step S5, a rim cutting step S6 and a washing step S7 as shown in FIG. 3.

The vitreous silica crucible manufacturing device 1 is roughly constituted by a mold 10 which has a melting space in the inner portion for melting a silica powder and forming a vitreous silica crucible, a driving mechanism not shown in the figure which rotates the mold 10 round the axis, and a plurality of carbon electrodes 13 which acts as an arc discharge device for heating the inner side of the mold 10 in addition to the storage of the mold 10.

The mold 10 is formed of, for example, carbon, and a number of pressure-reducing passages 12 which are open to the surface of inner portion of the mold 10 are formed in the inside, as shown in FIG. 4. The pressure-reducing passage 12 is connected with a pressure-reducing mechanism not shown in the figure which thus allows suction of air from the inner surface of mold via the pressure-reducing passage 12 at the time of rotating the mold 10.

In the silica-powder filling step, a silica powder layer 11 is formed by depositing silica raw powder on the inner surface of the mold 10. This silica-powder layer 11 is held on the inner-wall side due to the centrifugal force from the rotation of the mold 10.

A plurality of electrodes 13 is provided as the arc discharge device at the upper side of the mold 10 in the vitreous silica crucible manufacturing device 1. In the example shown in the figure, the electrodes 13 are formed in combination of three electrodes. The electrodes 13 are each fixed to a support 22 at the upper portion of a furnace, and the support 22 is provided with a device (omitted in the figure) to vertically move the electrode 21.

The support 22 is provided with a supporting portion 21 that supports the carbon electrode 13 while allowing setting the distance between the electrodes, a horizontally transferring device that allows the supporting portion 21 to move in a horizontal direction, and a vertically transferring device that allows the plurality of supporting portions 21 and the respective horizontally transferring device to move integrally in a vertical direction. The supporting portion 21 does the supporting in the manner of allowing the carbon electrode 13 to move round an angle setting axis 22, and is provided with a rotation device that controls the rotation angle of the angle setting axis 22. In order to adjust the distance D between the carbon electrodes 13, the angle of the carbon electrode 13 is controlled by the rotation device, the horizontal position of the supporting portion 21 is controlled by the horizontally transferring device, and the height of the supporting portion 21 is also controlled by the vertical transferring device.

The supporting portion 21 and the like are shown in only the left end of the carbon electrode 13 in the figure, but other electrodes are also supported by the same constitution and the height of each carbon electrode 13 can be individually controlled.

In the arc melting step S2, a position of the electrode 13 is arranged, and a pressure is reduced through the pressure-reducing passage 12 while heating the left silica-powder layer 11 with the arc discharge device, thereby melting the silica-powder layer 11 to form a vitreous silica layer.

In the cooling step S3, the vitreous silica layer is cooled, and then a vitreous silica crucible is taken out of the mold 10 as the taking out step S4.

Figure 5:
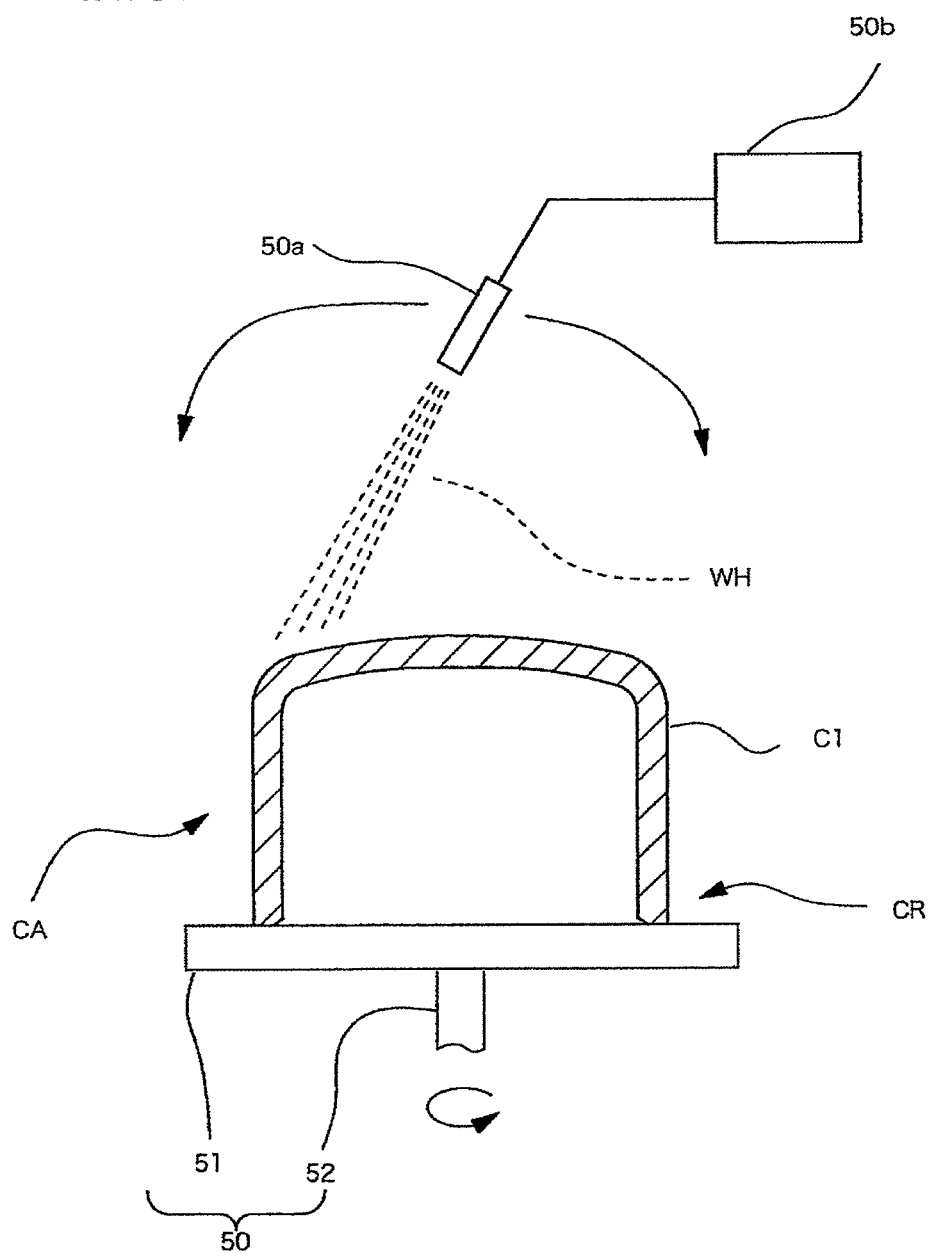
FIG. 5 is a pattern diagram showing a honing processing device related to a method of manufacturing a vitreous silica crucible of the invention.

Next, in the honing processing step S5, as shown in FIG. 5, a peripheral surface of the crucible C1 is subjected to a honing process by spraying from a nozzle 50a the high-pressure water WH which is controlled by a controlling device through a supplying device 50b, onto a vitreous silica crucible CA which is rotated while being held by a crucible holding device 50. The crucible holding device 50 has a placing stand 51 rotatable around a rotation axis 52. In the honing step S5, the crucible is placed on the placing stand 51 and covering the opening while making an axis of the honing rotation axis 52 match a central axis of the vitreous silica crucible CA, and the high-pressure water WH is sprayed from the nozzle 50a onto the outer surface of the crucible in a predetermined condition while rotating the crucible CA by the rotation axis 52.

At this time, the honing treatment is carried out by controlling water pressure, the amount of water the speed, the angle and distance to the outer surface of the crucible, spraying period and the like by the controlling device when spraying from the nozzle 50a, and the surface of the half-melted silica layer CC described above is adjusted in order to have a center line average roughness (Ra) of the surface of 50 to 200 µm and a thickness of the half-melted silica layer CC of 0.5 to 2.0 mm. As an example, in the case where the thickness of the half-melted silica layer CC is reduced or the surface roughness of the half-melted silica layer CC is reduced, the distance between the outer surface of the crucible and the nozzle is reduced each other. In the case of increasing the thickness of the half-melted silica layer CC or enhancing the surface roughness of the half-melted silica layer CC, increasing distance between the outer surface of the crucible and the nozzle thereby controls the layer thickness and the surface roughness.

Moreover, an upper edge portion of a side wall CR shown in FIG. 5 is cut to shape in the rim cutting step S6, the outer surface of the crucible and the inner surface of the crucible are washed in the washing step S7, thereby manufacturing a vitreous silica crucible.

Thus, in a rotary mold method, the vitreous silica crucible of the invention can be easily manufactured without changing the known manufacturing method drastically since the outer surface may the surface roughness described above when the outer surface of the crucible is taken out from a mold and subjected to a honing process after cooling.

The present invention can also be manufactured by so-called a thermal spraying method which supplies vitreous silica raw powder in the arc melting step. Sandblast or spray of high-pressure water can be employed in the honing process. In this case, the condition of the surface of the crucible can be controlled by the kind of particles, a particle size, the concentration or the like to be abrasive grains. As the particles, vitreous silica raw powder which has like quality (impurity concentration) to a raw material for the crucible, alumina or the like is applicable.

Figure 2:
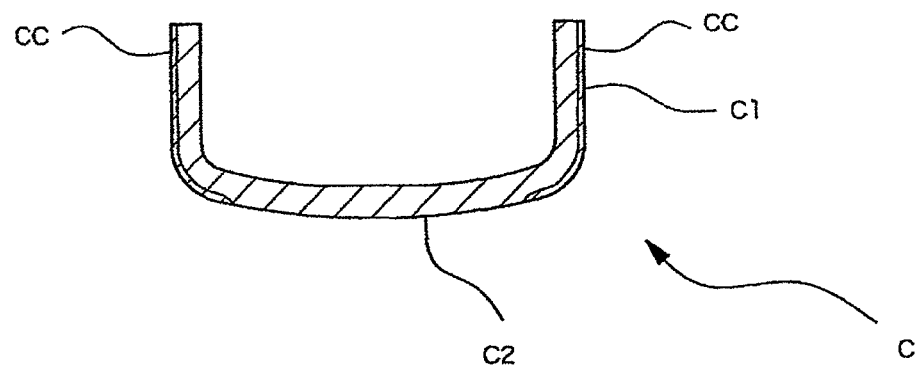
FIG. 2 is a longitudinal sectional view showing another embodiment of the vitreous silica crucible of the invention.

Furthermore, as shown in FIG. 2, a crucible can be also manufactured to provide the half-melted silica layer CC described above on the sidewall portion C1 of the vitreous silica crucible C and to exist the portion without the half-melted silica layer CC at the bottom. In this case, the thickness of the half-melted silica layer CC and the distribution can be controlled upon controlling a heating in the arc melting step S2 and upon controlling a honing state in the honing step S5.

EXAMPLES

Examples 1 to 3 and Comparative Examples 1 to 3

Hereinafter, the present invention will be described in detail with reference to Examples. In addition, Comparative Examples will be described with Examples.

A vitreous silica crucible shown in Table 1 (32-inch caliber, the outer surface bubble-containing layer of 121 nm and the inner surface transparent glass layer of 2 mm) was manufactured in accordance with a rotary mold method. Single-crystal silicon was pulled by using this vitreous silica crucible. As for the crucible after use, the thickness of the outer surface crystal layer, the condition of the outer surface and the rate of single crystallization of single-crystal silicon were shown in Table 1. The center line average roughness of the outer surface of the crucible was measured using a contact type surface roughness measuring instrument in accordance with a standard (JISO65/-1976). In addition, the thicknesses of the half-melted silica layer and the crystallization layer were measure based on a cross-sectional photomicrograph of the crucible.

As shown in Table 1, in Examples 1 to 3 of the invention, each surface of the outer surface layer was crystallized, and the thickness of the crystallized layer is sufficient. In addition, surface exfoliation on the outer surface layer is low. Accordingly, a high crystallization rate of 80 to 90% is obtained in pulling single-crystal silicon. Meanwhile, in Comparative Example 1, the crystallized layer of the surface of the outer surface layer is extremely thin since the surface of the outer surface layer does not have a half-melted silica layer. Consequently, the crucible is easy to deform under high temperature, so that the single crystallization rate is low. In Comparative Example 2, a half-melted silica layer exits on the surface of the outer surface layer, but the half-melted silica layer is extremely thick, so that exfoliation of the outer surface is high and the single crystallization rate is low. Moreover, in Comparative Example 3, the surface of the outer surface layer does not have a half-melted silica layer, and is a vitreous silica surface. Therefore, even if the surface roughness is increased, the crystallized layer is extremely thin, the crucible is easy to deform, and exfoliation of the outer surface is high, as a result, the single crystallization rate is the lowest.

TABLE 1

| | Thickness of Half-melted Vitreous Silica Layer (mm) | Center Line Average Roughness (μm) | Thickness of Crystallization Layer (mm) | Outer Surface Exfoliation | Single Crystallization Rate (%) |
|---|---|---|---|---|---|
| Example 1 | 0.6 | 60 | 1 | Little | 89 |
| Example 2 | 1.5 | 180 | 2.2 | Little | 90 |
| Example 3 | 0.4 | 60 | 0.6 | Little | 81 |
| Comp. Ex 1 | 0 | 20 | 0.2 | Little | 53 |
| Comp. Ex 2 | 2.2 | 60 | 0.7 | Much | 48 |
| Comp. Ex 3 | 0 | 220 | 0.1 | Little | 20 |

Here, the single crystallization rate is a single crystallization yield of a single-crystal silicon pulling, and is a weight of a straight body portion which can be obtain wafers of single-crystal silicon with no crystal dislocation/a total weight of raw polysilicon introduced in the crucible. If this crystallization rate differs by 1%, the obtained wafers differ by approximately 20 sheets.

INDUSTRIAL APPLICABILITY

Since a surface of the outer surface layer is made to be easily crystallizable under high temperatures when using the crucible, by adjusting the center line average roughness (Ra) of a half-melted vitreous silica layer which exists on a surface of the outer surface layer to be 50 to 200 μm, the crucible is difficult to deform under high temperature; and a high single crystallization rate can be obtained upon pulling of single-crystal silicon.

In addition, when processing a honing treatment after cooling and taking a glass crucible out of the mold in the manufacturing method according to a rotary mold method, the crucible can be treated to give the above-mentioned outer surface roughness, and the crucible can be easily manufactured without significantly changing the known manufacturing method.

The invention claimed is:

1. A vitreous silica crucible for pulling single-crystal silicon comprising:
    an outer surface layer which is formed of a bubble-containing vitreous silica layer, and an inner surface layer which is formed of a transparent vitreous silica layer, wherein:
    a half-melted vitreous silica layer is on the outer surface in a straight body portion of the crucible, and a center line average roughness (Ra) of a surface of the half-melted vitreous silica layer is 180 to 200 μm;
    a layer thickness of the half-melted vitreous silica layer is 1.5 to 2.0 mm; and
    a layer thickness of the crystallization layer after pulling the single-crystal silicon is 0.6 to 2.2 mm.

2. A method of manufacturing a vitreous silica crucible in accordance with a rotary mold method, comprising the steps of:
    heating the vitreous silica powder which is accumulated on the inner surface of a rotary mold, from a space side of the mold;
    forming a glass crucible by vitrification;
    taking the glass crucible out of the mold after cooling; and
    subjecting the half-melted vitreous silica powder composed of unmelted or melted vitreous silica powder to a honing process in order for the center line average roughness (Ra) of the half-melted vitreous silica layer of the outer surface in a straight body portion of the crucible to be 180 to 200 μm, the layer thickness of the half-melted vitreous silica layer to be 1.5 to 2.0 mm, and a layer thickness of the crystallization layer after pulling the single-crystal silicon to be 0.6 to 2.2 mm.

* * * * *